(12) United States Patent
Matsuo

(10) Patent No.: US 8,129,004 B2
(45) Date of Patent: Mar. 6, 2012

(54) DONOR SUBSTRATE AND TRANSFER METHOD USING SAME, METHOD OF MANUFACTURING DISPLAY DEVICE, AND SYSTEM OF MANUFACTURING DISPLAY DEVICE

(75) Inventor: Keisuke Matsuo, Kanagawa (JP)

(73) Assignee: Sony Corporation, Tokyo (JP)

( * ) Notice: Subject to any disclaimer, the term of this patent is extended or adjusted under 35 U.S.C. 154(b) by 586 days.

(21) Appl. No.: 12/295,431

(22) PCT Filed: Apr. 5, 2007

(86) PCT No.: PCT/JP2007/057652
§ 371 (c)(1), (2), (4) Date: Sep. 30, 2008

(87) PCT Pub. No.: WO2007/116934
PCT Pub. Date: Oct. 18, 2007

(65) Prior Publication Data
US 2009/0134787 A1 May 28, 2009

(30) Foreign Application Priority Data
Apr. 6, 2006 (JP) ................. 2006-104991

(51) Int. Cl.
*B41M 5/00* (2006.01)
*B29C 65/00* (2006.01)
*B32B 37/00* (2006.01)
*B32B 38/04* (2006.01)
*G03C 8/00* (2006.01)

(52) U.S. Cl. ............... 428/32.8; 156/272.2; 156/272.8; 156/379.6; 430/199; 430/200; 430/321

(58) Field of Classification Search ................ 428/32.8, 428/32.81; 156/230, 272.2, 379.6; 430/199–200, 430/321
See application file for complete search history.

(56) References Cited

U.S. PATENT DOCUMENTS
5,935,720 A 8/1999 Chen et al.
(Continued)

FOREIGN PATENT DOCUMENTS
JP 9-167684 6/1997
(Continued)

OTHER PUBLICATIONS
International Search Report dated Jun. 26, 2007.
Japanese Office Action issued on Oct. 12, 2011 in connection with counterpart JP Application No. 2006-104991.

*Primary Examiner* — Nimeshkumar Patel
*Assistant Examiner* — Jose M Diaz
(74) *Attorney, Agent, or Firm* — SNR Denton US LLP

(57) ABSTRACT

A red organic light emitting element formed by a simple process of a thermal transfer method and a display device including the same are provided. A donor substrate 100 has a reflecting layer 120 in a planned formation region 100R1 of a red transfer layer viewed from a front face side of a base 110, and has the reflecting layer 120 in a non-transfer region 100NP viewed from the rear face side of the base 110. A red transfer layer 200R is formed on the whole area on the front face side of the base 110, laser light LB1 is irradiated from the front face side of the base 110 to form the red transfer layer 200R only in the red transfer layer planned formation region 100R1, and then a green transfer layer 200G is formed on the whole area on the front face side of the base 110. The donor substrate 100 and the substrate 11 are oppositely arranged, laser light LB2 is irradiated from the rear face side of the base 110, and thereby the red transfer layer 200R and other portions the non-transfer region 100NP of the green transfer layer 200G are transferred at a time to the substrate 11.

9 Claims, 15 Drawing Sheets

U.S. PATENT DOCUMENTS

| | | | |
|---|---|---|---|
| 7,108,949 B2 * | 9/2006 | Kim et al. | 430/200 |
| 2003/0193043 A1 | 10/2003 | Chang et al. | |
| 2005/0247940 A1 * | 11/2005 | Shibata et al. | 257/66 |
| 2006/0084006 A1 * | 4/2006 | Kang et al. | 430/199 |
| 2006/0170077 A1 * | 8/2006 | Aoki et al. | 257/642 |
| 2008/0113292 A1 * | 5/2008 | Matsuo | 430/270.1 |
| 2009/0266479 A1 * | 10/2009 | Chung et al. | 156/247 |

FOREIGN PATENT DOCUMENTS

| | | |
|---|---|---|
| JP | 10-308281 | 11/1998 |
| JP | 2002-216957 | 8/2002 |
| JP | 2003-252874 | 9/2003 |
| JP | 2004-043646 | 2/2004 |
| JP | 2005-108723 | 4/2005 |
| JP | 2005-235742 | 9/2005 |

* cited by examiner

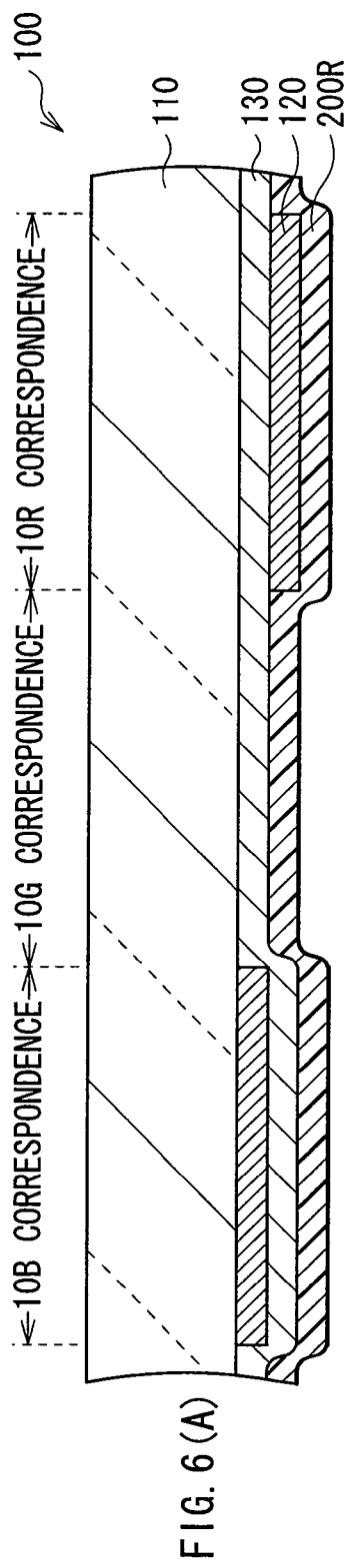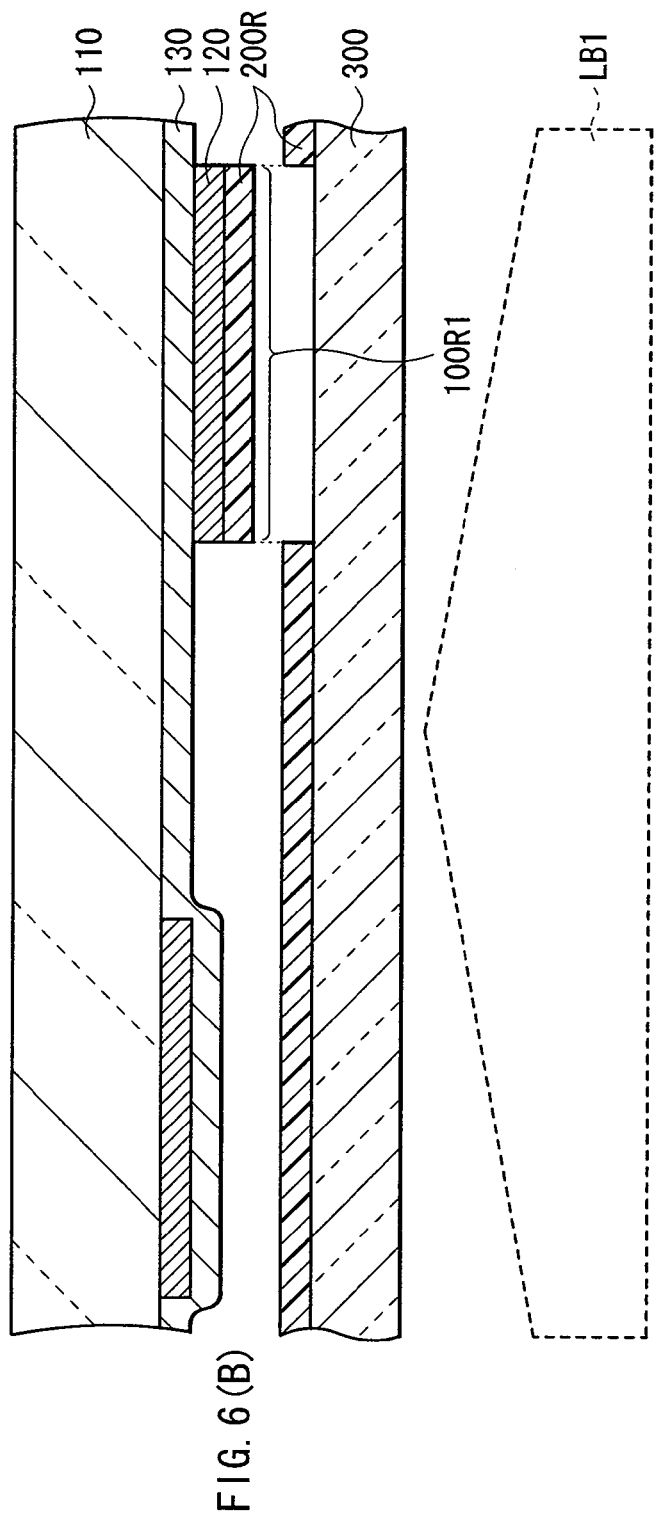
FIG. 6(A)
FIG. 6(B)

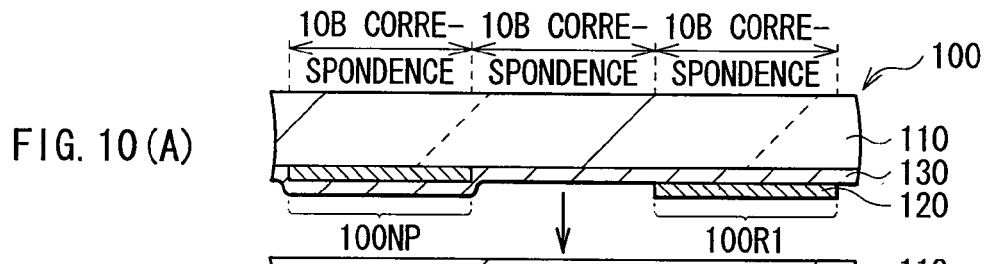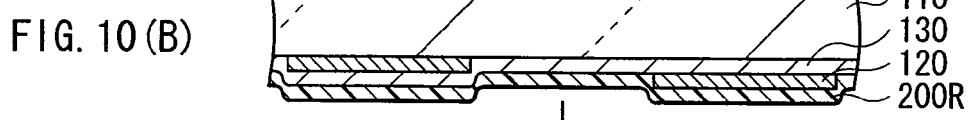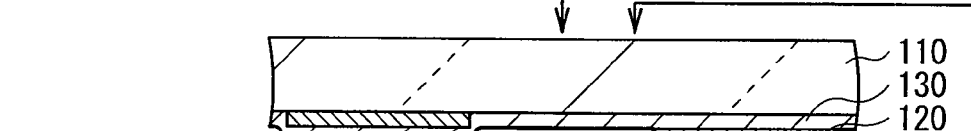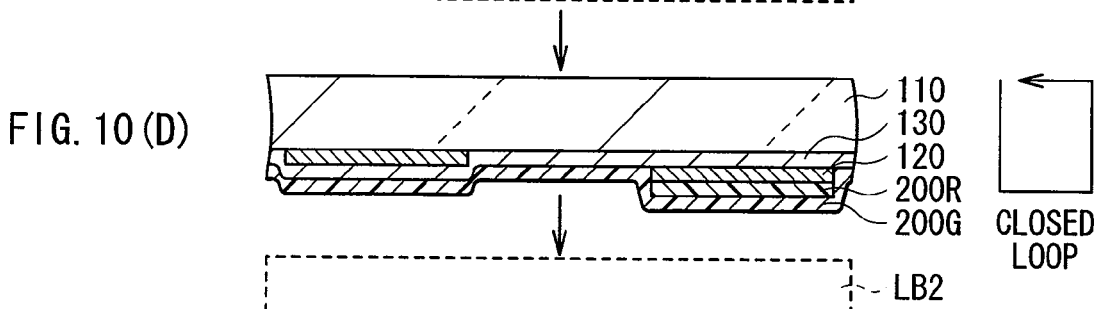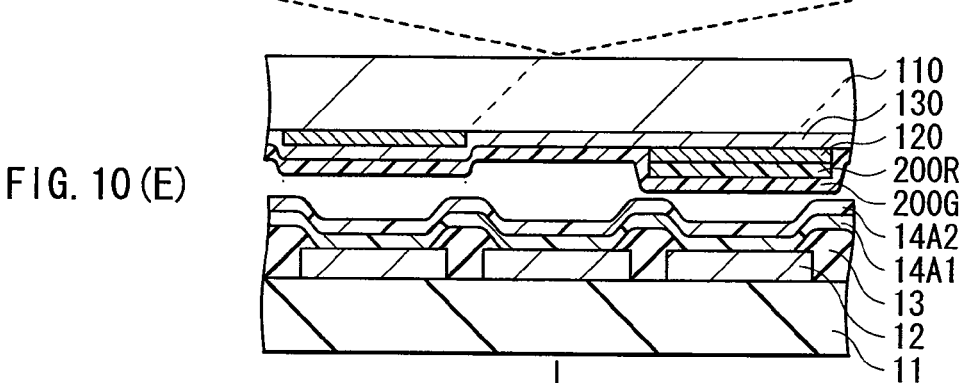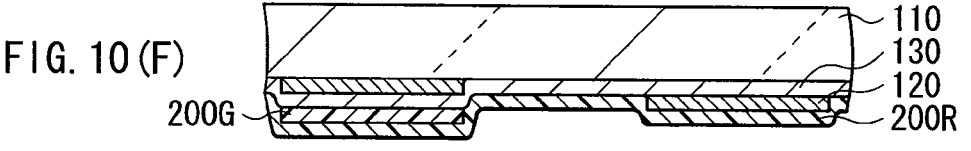

DONOR SUBSTRATE AND TRANSFER METHOD USING SAME, METHOD OF MANUFACTURING DISPLAY DEVICE, AND SYSTEM OF MANUFACTURING DISPLAY DEVICE

TECHNICAL FIELD

The present invention relates to a red organic light emitting element formed by thermal transfer method and a display device, a donor substrate and a transfer method used for manufacturing the same, a method of manufacturing a display device, and a system of manufacturing a display device.

BACKGROUND ART

As one of methods of manufacturing an organic light emitting element, pattern fabrication method using thermal transfer has been disclosed (for example, refer to Patent Document 1 and Patent Document 2). In the thermal transfer method of the related art, in general, it is necessary to perform transfer three times that is the same number as the number of light emitting colors to form three-color of red, green, and blue organic light emitting elements. The same is applied to a case adopting a common layer for part of organic layers (for example, refer to Patent Document 3).

Patent Document 1: Japanese Unexamined Patent Application Publication No. 9-167684
Patent Document 2: Japanese Unexamined Patent Application Publication No. 2002-216957
Patent Document 3: Japanese Unexamined Patent Application Publication No. 2005-235742

DISCLOSURE OF THE INVENTION

However, in the transfer method, it is necessary to perform many complicated steps such as matching a donor substrate with a substrate as a transfer target, separation, and laser irradiation. Accordingly, the device becomes complicated and expensive, and it is hard to reduce the takt time. Further, since each exclusive donor substrate is necessary for each color, there has been an issue that the running cost is high.

In view of the foregoing, it is an object of the invention to provide a red organic light emitting element that can be formed by a simple step using thermal transfer method and a display device including the same, a donor substrate and a transfer method used for manufacturing the red organic light emitting element, a method of manufacturing a display device, and a system of manufacturing a display device.

A red organic light emitting element according to the present invention includes a first electrode, a red organic layer having a mixed layer containing a red light emitting material and a green light emitting material, and a second electrode sequentially over a substrate.

A display device according to the present invention includes the foregoing red organic light emitting element of the present invention.

In the red organic light emitting element according to the present invention or the display device according to the present invention, since the red organic layer has the mixed layer containing the red light emitting material and the green light emitting material, energy transfer is generated in red having a lower energy level and thus red light emission becomes dominant.

A first donor substrate according to the present invention is used for selectively forming a transfer layer in part of a front face side of a base, irradiating a radiant ray from a rear face side of the base, and thereby transferring the transfer layer to other substrate. In the first donor substrate, a reflecting layer is provided in a planned formation region of the transfer layer, and an absorbing layer is provided in a region other than the planned formation region of the transfer layer viewed from the front face side of the base.

A first transfer method according to the present invention is used for transferring a transfer layer from a donor substrate in which the transfer layer is selectively formed in part of a base to other substrate. In the first transfer method, as the donor substrate, a donor substrate in which a reflecting layer is provided in a planned formation region of the transfer layer and an absorbing layer is provided in a region other than the planned formation region of the transfer layer viewed from a front face side of the base is used. The first transfer method includes the steps of: forming the transfer layer on a whole area on the front face side of the base; irradiating a radiant ray from the front face side of the base and thereby selectively removing the transfer layer in the region where the absorbing layer is formed viewed from the front face side of the base; and oppositely arranging the donor substrate and the other substrate, irradiating a radiant ray from a rear face side of the base, and thereby transferring the transfer layer on the reflecting layer to the other substrate.

The first transfer method according to the present invention uses the first donor substrate of the present invention. After the transfer layer is formed on the whole area on the front face side of the base, the radiant ray is irradiated from the front face side of the base and thereby the transfer layer in the region where the absorbing layer is formed viewed from the front face side of the base is selectively removed, and the transfer layer is left only on the reflecting layer. After that, the donor substrate and the other substrate are oppositely arranged, the radiant ray is irradiated from the rear face side of the base, and thereby the transfer layer on the reflecting layer is transferred.

A second donor substrate according to the present invention is used for forming a transfer layer on a front face side of a base, irradiating a radiant ray from a rear face side of the base, and thereby selectively transferring part of the transfer layer to other substrate. In the second donor substrate, a reflecting layer is provided in a non-transfer region of the transfer layer not being transferred to the other substrate, and an absorbing layer is provided in a region other than the non-transfer region viewed from the rear face side of the base.

A second transfer method according to the present invention is used for selectively transferring part of a transfer layer from a donor substrate in which the transfer layer is formed over a base to other substrate. In the second transfer method, as the donor substrate, a donor substrate in which a reflecting layer is provided in a non-transfer region of the transfer layer not being transferred to the other substrate and an absorbing layer is provided in a region other than the non-transfer region viewed from a rear face side of the base is used. The second transfer method includes the steps of: forming the transfer layer on a whole area on a front face side of the base; and oppositely arranging the donor substrate and the other substrate, irradiating a radiant ray from the rear face side of the base, and thereby selectively transferring other portions than the non-transfer region of the transfer layer to the other substrate.

The second transfer method according to the present invention uses the second donor substrate of the present invention. After the transfer layer is formed on the whole area on the front face side of the base, the donor substrate and the other substrate are oppositely arranged, the radiant ray is irradiated from the rear face side of the base, and thereby the section other than the non-transfer region of the transfer layer is selectively transferred to the other substrate, and the non-transfer region portion is not transferred and left over the base.

A method of manufacturing a display device according to the present invention is a method of manufacturing a display device including, on a substrate, a red organic light emitting element, a green organic light emitting element, and a blue organic light emitting element. In the method of manufacturing a display device, a donor substrate that has a reflecting layer in a red transfer layer planned formation region corresponding to a planned formation region of the red organic light emitting element in the substrate and an absorbing layer in a region other than the red transfer layer planned formation region viewed from a front face side of the substrate, and has the reflecting layer in a non-transfer region of a green transfer layer and the absorbing layer in a region other than the green transfer layer non-transfer region viewed from a rear face side of the base is used. The method of manufacturing a display device includes: a transfer layer formation step of forming the red transfer layer containing a red light emitting material on a whole area on the front face side of the base, irradiating a radiant ray from the front face side of the base and thereby selectively removing the red transfer layer in the region where the absorbing layer is formed viewed from the front face side of the base, and then forming the green transfer layer containing a green light emitting material on the whole area on the front face side of the base; and a collective transfer step of oppositely arranging the donor substrate and the substrate and irradiating a radiant ray from the rear face side of the base, and thereby transferring the red transfer layer and other portions than the green transfer layer non-transfer region of the green transfer layer to the substrate at a time.

A system of manufacturing a display device according to the present invention manufactures a display device including, on a substrate, a red organic light emitting element, a green organic light emitting element, and a blue organic light emitting element. In the system of manufacturing a display device, a donor substrate that has a reflecting layer in a red transfer layer planned formation region corresponding to a planned formation region of the red organic light emitting element in the substrate and an absorbing layer in a region other than the red transfer layer planned formation region viewed from a front face side of the base, and has the reflecting layer in a non-transfer region of a green transfer layer and the absorbing layer in a region other than the green transfer layer non-transfer region viewed from a rear face side of the base is used. The system of manufacturing a display device includes: a transfer layer formation section including a red transfer layer formation section forming the red transfer layer containing a red light emitting material on a whole area on the front face side of the base, a transfer layer selective removal section irradiating a radiant ray from the front face side of the base and thereby selectively removing the red transfer layer in the region where the absorbing layer is formed viewed from the front face side of the base, and a green transfer layer formation section forming the green transfer layer containing a green light emitting material on the whole area on the front face side of the base; and a collective transfer section oppositely arranging the donor substrate and the substrate and irradiating a radiant ray from the rear face side of the base, and thereby transferring the red transfer layer and other portions than the green transfer layer non-transfer region of the green transfer layer to the substrate at a time.

According to the red organic light emitting element of the present invention or the display device of the present invention, since the red organic layer has the mixed layer containing the red light emitting material and the green light emitting material, the mixed layer can be formed by the simple step that the red transfer layer containing the red light emitting material and the green transfer layer containing the green light emitting material are transferred at a time from the donor substrate by thermal transfer method.

According to the first transfer method of the present invention, the first donor substrate of the present invention is used. Thus, after the transfer layer is formed on the whole area on the front face side of the base, the radiant ray is irradiated from the front face side of the base and thereby it is possible that the transfer layer is selectively removed and the transfer layer is left only on the reflecting layer.

According to the second transfer method of the present invention, the second donor substrate of the present invention is used. Thus, after the transfer layer is formed on the whole area on the front face side of the base, the donor substrate and the substrate are oppositely arranged, the radiant ray is irradiated from the rear face side of the base, and thereby it is possible that the portion other than the non-transfer region of the transfer layer is selectively transferred to the substrate, and the non-transfer region portion is not transferred and left on the base.

According to the method of manufacturing a display device of the present invention or the system of manufacturing a display device of the present invention, the donor substrate of the present invention is used, and the red transfer layer and the green transfer layer are formed on the donor substrate and are transferred at a time to the substrate. Thus, one-time transfer is enough for forming the red organic light emitting element and the green organic light emitting element, and the display device can be manufactured by the simple steps.

BRIEF DESCRIPTION OF THE DRAWINGS

FIG. 6 Cross section views showing steps following FIG. 3.

FIG. 10 Cross section views showing a process of fabricating and recycling the donor substrate in the order of steps.

BEST MODE FOR CARRYING OUT THE INVENTION

An embodiment of the present invention will be hereinafter described in detail with reference to the drawings.

Figure 1:
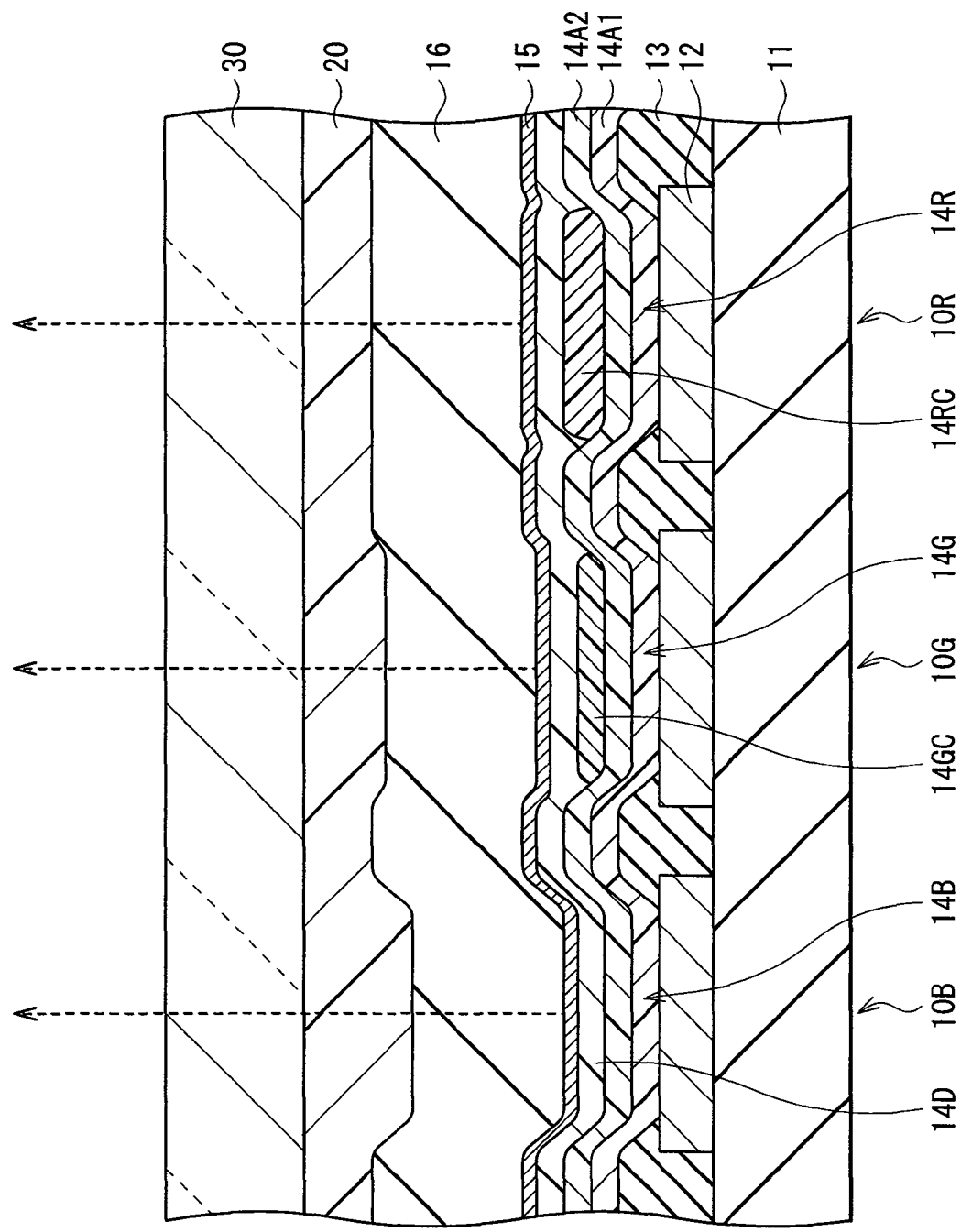
FIG. 1 A cross section view showing a configuration of a display device according to an embodiment of the present invention.

FIG. 1 shows a cross sectional configuration of a display device using a red organic light emitting element according to an embodiment of the present invention. The display device is used as an ultrathin organic light emitting color display device or the like. In the display device, for example, a red organic light emitting element 10R generating red light, a green organic light emitting element 10G generating green light, and a blue organic light emitting element 10B generating blue light are sequentially formed in a state of matrix as a whole on a substrate 11 made of glass or the like. The red organic light emitting element 10R, the green organic light emitting element 10G, and the blue organic light emitting element 10B have a planar reed-shape, and a combination of the red organic light emitting element 10R, the green organic light emitting element 10G, and the blue organic light emitting element 10B adjacent to each other composes one pixel. The pixel pitch is, for example, 300 µm.

In the red organic light emitting element 10R, a first electrode 12 as an anode, an insulating film 13, a red organic layer 14R including a mixed layer 14RC described later, and a second electrode 15 as a cathode are stacked in this order from the substrate 11 side. In the green organic light emitting element 10G, the first electrode 12, the insulating film 13, a green organic layer 14G including a green monochromatic layer 14GC described later, and the second electrode 15 are stacked in this order from the substrate 11 side. In the blue organic light emitting element 10B, the first electrode 12, the insulating film 13, a blue organic layer 14B including a blue monochromatic layer 14D described later, and the second electrode 15 are stacked in this order from the substrate 11 side.

The red organic light emitting element 10R, the green organic light emitting element 10G, and the blue organic light emitting element 10B are coated with a protective film 16. Further, a sealing substrate 30 made of glass or the like is bonded to the whole area of the protective film 16 with an adhesive layer 20 in between and thereby the red organic light emitting element 10R, the green organic light emitting element 10G, and the blue organic light emitting element 10B are sealed.

The first electrode 12 is made of, for example, ITO (indium tin composite oxide). To enable active matrix drive, the first electrode 12 may be provided on a TFT (thin-film transistor) formed on the substrate 11 and a planarizing insulating film covering the TFT (either not shown). In this case, the first electrode 12 is electrically connected to the TFT through a contact hole provided on the planarizing insulating film.

The insulating film 13 is intended to secure insulation between the first electrode 12 and the second electrode 15, and to obtain a desired shape of a light emitting region accurately. The insulating film 13 is made of, for example, a photosensitive resin such as polyimide. The insulating film 13 is provided with an aperture corresponding to the light emitting region.

The red organic layer 14R has, for example, a structure in which a hole injection layer 14A1, a hole transport layer 14A2, the mixed layer 14RC, the blue monochromatic layer 14D, and an electron transport layer 14E are sequentially layered from the first electrode 12 side. The green organic layer 14G has, for example, a structure in which the hole injection layer 14A1, the hole transport layer 14A2, the green monochromatic layer 14GC, the blue monochromatic layer 14D, and the electron transport layer 14E are sequentially stacked from the first electrode 12 side. The blue organic layer 14B has, for example, a structure in which the hole injection layer 14A1, the hole transport layer 14A2, the blue monochromatic layer 14D, and the electron transport layer 14E are sequentially stacked from the first electrode 12 side. Of the foregoing layers, the hole injection layer 14A1, the hole transport layer 14A2, the blue monochromatic layer 14D, and the electron transport layer 14E are layers common to the red organic light emitting element 10R, the green organic light emitting element 10G, and the blue organic light emitting element 10B. The hole injection layer 14A1 is intended to increase the hole injection efficiency and is a buffer layer to prevent leakage. The hole transport layer 14A2 is intended to increase hole transport efficiency to the mixed layer 14RC, the green monochromatic layer 14GC, and the blue monochromatic layer 14D as a light emitting layer. The mixed layer 14RC, the green monochromatic layer 14GC, and the blue monochromatic layer 14D are intended to generate light due to electron-hole recombination by applying the electric field. The electron transport layer 14E is intended to increase electron transport efficiency to the mixed layer 14RC, the green monochromatic layer 14GC, and the blue monochromatic layer 14D. The hole injection layer 14A1, the hole transport layer 14A2, and the electron transport layer 14E may be provided according to needs, and each structure may be different from each other according to emission color. An electron injection layer made of LiF, $Li_2O$ or the like (not shown) may be provided between the electron transport layer 14E and the second electrode 15.

The hole injection layer 14A1 is, for example, 5 nm to 300 nm thick, for example, 25 nm thick. The hole injection layer 14A1 is made of 4,4',4"-tris(3-methylphenylphenylamino) triphenylamine (m-MTDATA) or 4,4',4"-tris(2-naphthylphenylamino)triphenylamine (2-TNATA). The hole transport layer 14A2 is, for example, 5 nm to 300 nm thick, for example, 30 nm thick. The hole transport layer 14A2 is made of 4,4'-bis(N-1-naphthyl-N-phenylamino)biphenyl (α-NPD).

The mixed layer 14RC contains a red light emitting material and at least one of an electron hole transport material, an electron transport material, and a both charge transport material. The red light emitting material may be fluorescent or phosphorescent. The mixed layer 14RC is, for example, 10 nm to 100 nm thick, for example, 15 nm thick. The mixed layer 14RC is made of a material obtained by mixing 30 wt % of 2,6-bis[(4'-methoxydiphenylamino)styryl]-1,5-dicyanonaphthalene (BSN) as the red light emitting material with ADN(di(2-naphthyl)anthracene).

The green monochromatic layer 14GC contains a green light emitting material and at least one of an electron hole transport material, an electron transport material, and a both charge transport material. The green light emitting material may be fluorescent or phosphorescent. The green monochromatic layer 14GC is, for example, 10 nm to 100 nm thick, for example, 15 nm thick. The green monochromatic layer 14GC is made of a material obtained by mixing 5 wt % of Coumarin 6 as the green light emitting material with ADN.

The blue monochromatic layer 14D contains a blue light emitting material and at least one of an electron hole transport material, an electron transport material, and a both charge transport material. The blue light emitting material may be fluorescent or phosphorescent. The blue monochromatic layer 14D is, for example, 10 nm to 100 nm thick, for example, 15 nm thick. The blue monochromatic layer 14D is made of a material obtained by mixing 2.5 wt % of 4,4'-bis [2-{4-(N,N-diphenylamino)phenyl}vinyl]biphenyl (DPAVBi) as the blue light emitting material with ADN.

The electron transport layer 14E is, for example, 5 nm to 300 nm thick, for example, 20 nm thick. The electron transport layer 14E is made of 8-hydroxyquinoline aluminum ($Alq_3$).

The second electrode 15 is composed of a transparent electrode or a semi-transmissive electrode. Light generated in the mixed layer 14RC, the green monochromatic layer 14GC, and the blue monochromatic layer 14D is extracted from the second electrode 15 side. The second electrode 15 is, for example, 5 nm to 50 nm thick, and is made of a simple substance or an alloy of metal element such as aluminum (Al), magnesium (Mg), calcium (Ca), sodium (Na) and the like. Specially, an alloy of magnesium and silver (MgAg alloy) is preferable.

The protective film 16 is intended to prevent moisture or the like from entering into the red organic layer 14R, the green organic layer 14G, and the blue organic layer 14B. The protective film 16 is made of a material having low permeability and low water absorbability, and has a sufficient thickness. Further, the protective film 16 is made of a material having high transmission to light generated in the mixed layer 14RC, the green monochromatic layer 14GC, and the blue monochromatic layer 14D, for example, a material having a transmission factor of 80% or more. Such a protective film 16 is, for example, about 2 μm to 3 μm thick, and is made of an inorganic amorphous insulative material. Specifically, amorphous silicon (α-Si), amorphous silicon carbide (α-SiC), amorphous silicon nitride (α-$Si_{1-x}N_x$), and amorphous carbon (α-C) are preferable. These inorganic amorphous insulative materials do not form grains, and thus have low permeability and become the favorable protective film 16. The protective film 16 may be made of a transparent conductive material such as ITO.

The adhesive layer 20 is made of a thermosetting resin or an ultraviolet cure resin.

The sealing substrate 30 is located on the second electrode 15 side of the red organic light emitting element 10R, the green organic light emitting element 10G, and the blue organic light emitting element 10B. The sealing substrate 30 is intended to seal the red organic light emitting element 10R, the green organic light emitting element 10G, and the blue organic light emitting element 10B together with the adhesive layer 20. To extract light generated in the mixed layer 14RC, the green monochromatic layer 14GC, and the blue monochromatic layer 14D from the second electrode 15 side, the sealing substrate 30 is made of a material such as glass transparent to the light generated in the red organic light emitting element 10R, the green organic light emitting element 10G, and the blue organic light emitting element 10B.

The display device can be manufactured, for example, as follows.

Figure 2:
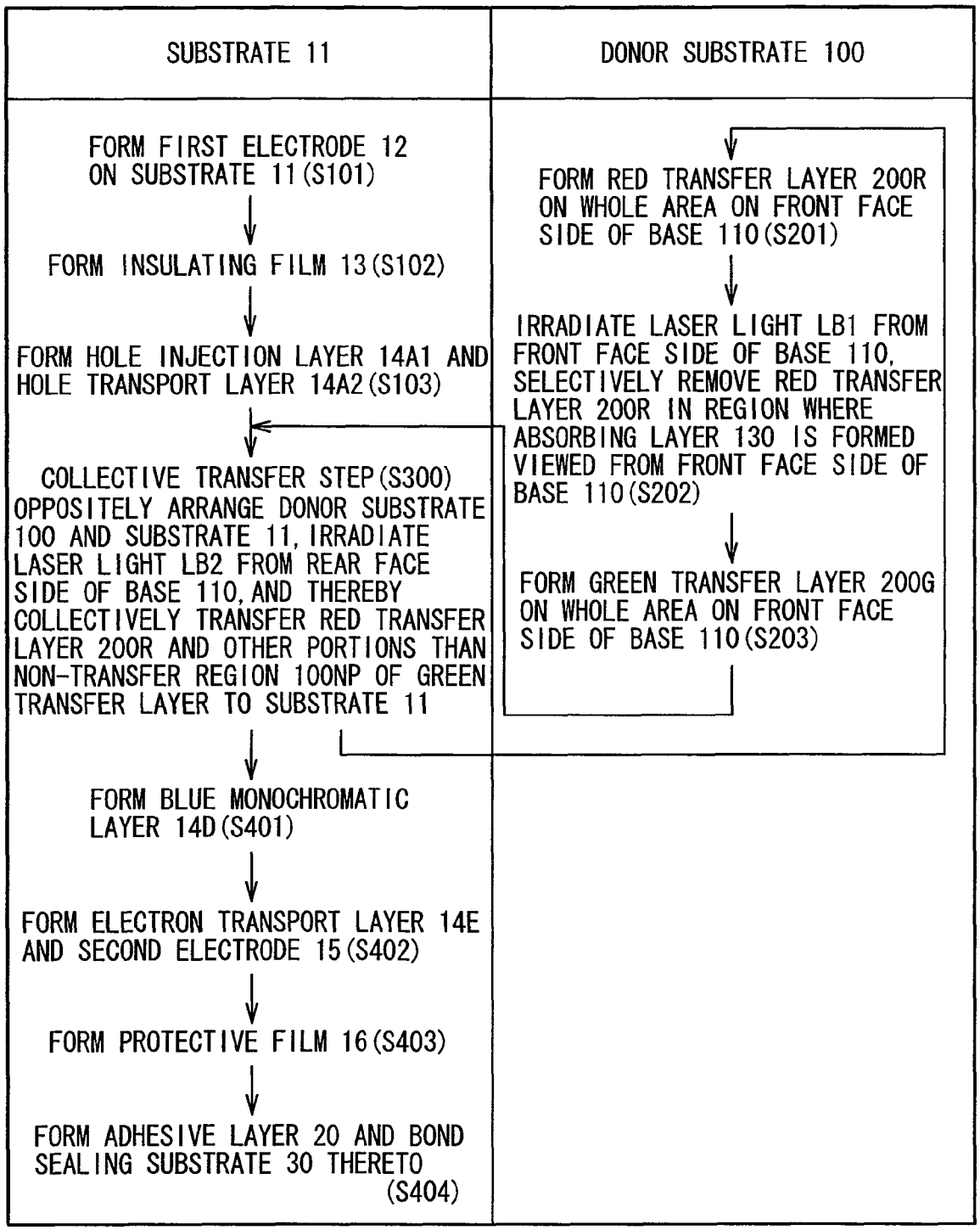
FIG. 2 A flowchart showing a flow of a method of manufacturing the display device shown in FIG. 1.
Figure 3:
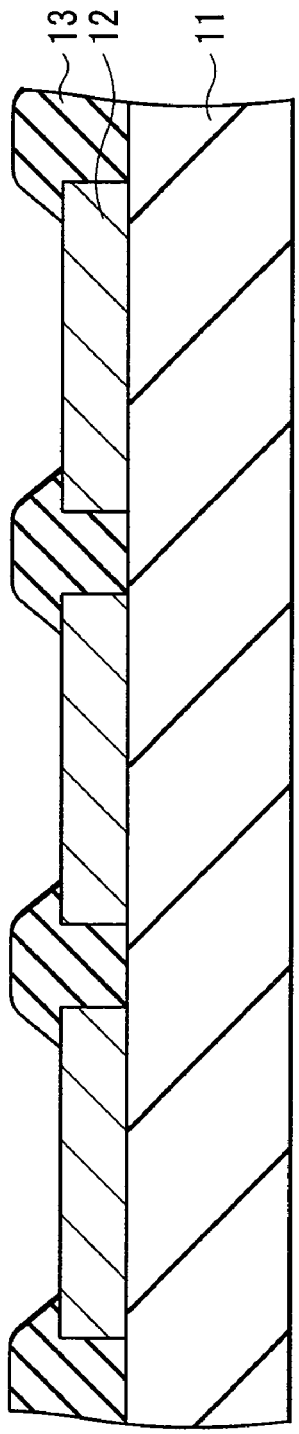
FIG. 3 Cross section views showing the manufacturing method shown in FIG. 2 in the order of steps.
Figure 3:
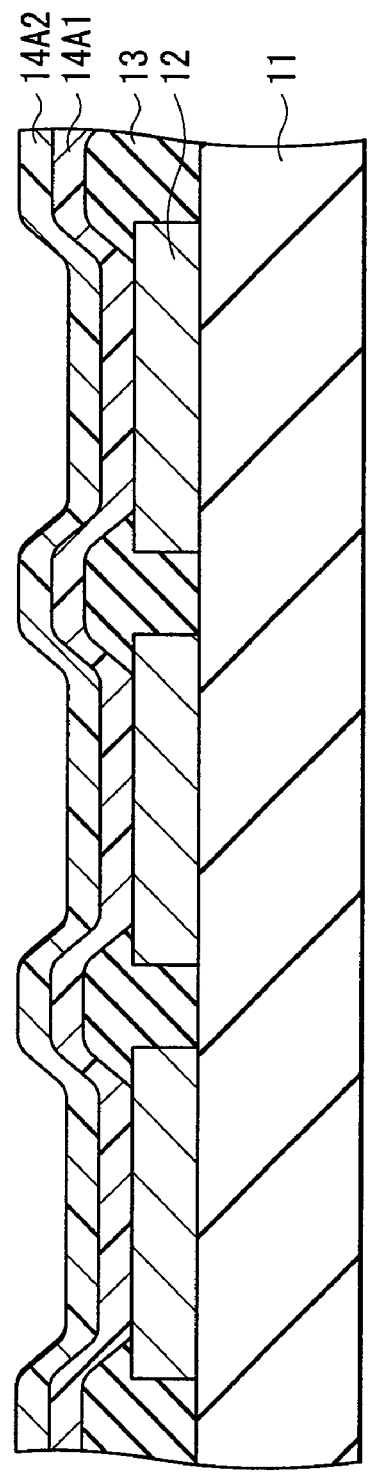

FIG. 2 is a flowchart showing a flow of a method of manufacturing the display device. FIG. 3 to FIG. 11 show the method of manufacturing the display device shown in FIG. 2 in the order of steps.

First, as shown in FIG. 3(A), the first electrode 12 made of the foregoing material is formed on the substrate 11 made of the foregoing material by, for example, sputtering method, and shaped into a given shape by, for example, dry etching (step S101). In a given position of the substrate 11, an alignment mark to be used for the alignment with a donor substrate in after-mentioned collective transfer step is formed.

Next, also as shown in FIG. 3(A), the whole area of the substrate 11 is coated with a photosensitive resin, the resultant is shaped by, for example, photolithography method to provide an aperture in a section corresponding to the first electrode 12. The resultant is fired to form the insulating film 13 (step S102).

Subsequently, as shown in FIG. 3(B), for example, by evaporation method, the hole injection layer 14A1 and the hole transport layer 14A2 that have the foregoing thickness and are made of the foregoing material are sequentially formed (step S103).

After that, on the hole transport layer 14A2, by thermal transfer method with the use of the donor substrate, the mixed layer 14RC is formed in a planned formation region 10R1 of the red organic light emitting element 10R, and the green monochromatic layer 14GC is formed in a planned formation region 10G1 of the green organic light emitting element 10G. This step includes transfer layer formation step and the collective transfer step.

(Structure of Donor Substrate)

Figure 4:
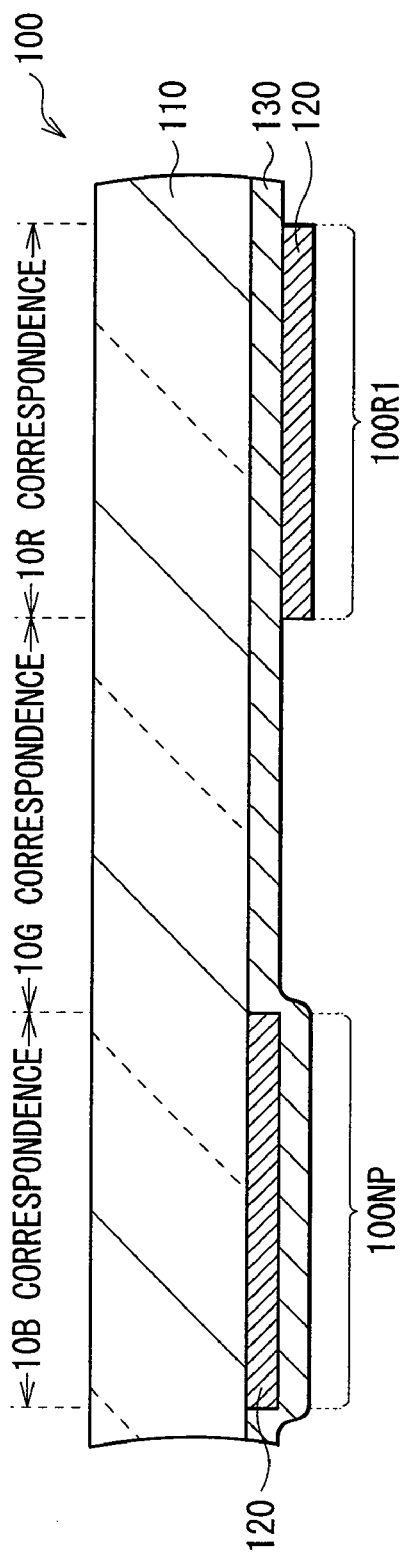
FIG. 4 A cross section view showing a structure of a donor substrate to be used in the manufacturing method shown in FIG. 2.

FIG. 4 shows a structure of the donor substrate to be used in this step in a state that the donor substrate is not used yet and a transfer layer is not formed yet. A donor substrate 100 has a reflecting layer 120 and an absorbing layer 130 on the front face side of a base 110, that is, on the side opposed to the substrate 11. The base 110 is made of a material that has rigidity enabling the alignment with the substrate 11 and has high transmission to laser light, for example, glass or a resin such as acryl. The reflecting layer 120 is made of a metal material having a high reflectance such as silver (Ag) and an alloy containing silver (Ag). In addition, only for long wavelength range, the component material of the reflecting layer 120 may be gold (Au), copper (Cu), or an alloy containing these. The absorbing layer 130 is made of a metal material having a high absorptance such as chromium (Cr), molybdenum (Mo), titanium (Ti), and an alloy containing these. The absorbing layer 130 may be made of a carbon (C) or a black pigment.

The donor substrate 100 has, viewed from the front face side of the base 110, the reflecting layer 120 in a red transfer layer planned formation region 100R1 corresponding to the planned formation region of the red organic light emitting element 10R in the substrate 11, and the absorbing layer 130 in other regions. Thereby, in the donor substrate 100, the red transfer layer can be selectively formed only on the reflecting layer 120.

Further, the donor substrate 100 has, viewed from the rear face side of the base 110, the reflecting layer 120 in a non-transfer region 100NP of a green transfer layer (hereinafter simply referred to as "non-transfer region"), and the absorbing layer 130 in other regions. Thereby, in the donor substrate 100, the green transfer layer of the non-transfer region 100NP is not transferred to the substrate 11 but can be left on the base 110. The non-transfer region 100NP corresponds to a planned formation region 10B1 of the blue organic light emitting element 10B in the substrate 11.

In the red transfer layer planned formation region 100R1, the absorbing layer 130 and the reflecting layer 120 are formed sequentially from the base 110 side. By providing the absorbing layer 130 between the reflecting layer 120 and the base 110 as above, the red transfer layer can be transferred to the substrate 11 by irradiating laser light from the rear face side of the base 110.

Figure 5:
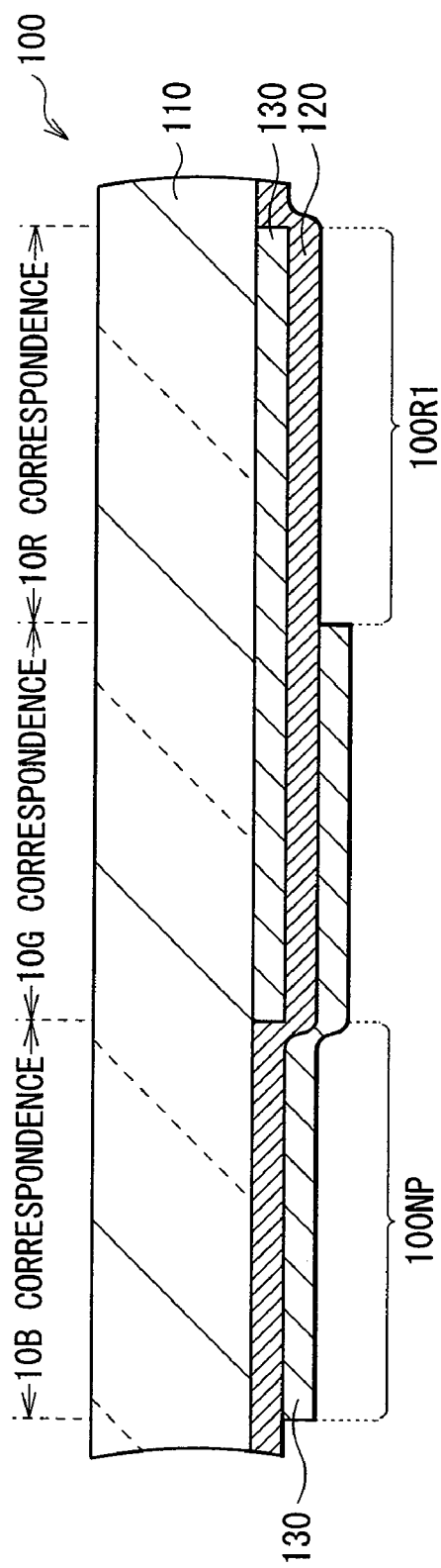
FIG. 5 A cross section view showing a modification of the donor substrate shown in FIG. 4.

As far as the foregoing conditions are satisfied, the lamination structure of the reflecting layer 120 and the absorbing layer 130 on the base 110 is not limited to the structure shown in FIG. 4, but may be other lamination structure. For example, FIG. 4 shows the structure in which the absorbing layer 130 is provided on the whole area on the front face side of the base 110, and the reflecting layer 120 is partially provided. However, as shown in FIG. 5, it is possible that the reflecting layer 120 is provided on the whole area on the front face side of the base 110, and the absorbing layer 130 is partially provided.

(Transfer Layer Formation Step)

For the donor substrate 100, first, as shown in FIG. 6(A), a red transfer layer 200R containing the foregoing red light emitting material is formed on the whole area on the front face side of the base 110 by, for example, vacuum evaporation (step S201).

Next, as shown in FIG. 6(B), a transparent substrate 300 for collecting removed materials is approximated to or contacted with the donor substrate 100. Then, laser light LB1 is irradiated from the front face side of the base 110 through the transparent substrate 300. The laser light LB1 is photothermally converted in the absorbing layer 130. Thus, the red transfer layer 200R in a region where the absorbing layer 130 is formed viewed from the front face side of the base 110 is selectively removed (step S202). Thereby, the red transfer layer 200R is formed only in the red transfer layer planned formation region 100R1. In this case, since the reflecting layer 120 is provided only in the red transfer layer planned formation region 100R1, it is not necessary to perform the complicated step that a spot shape of laser light is shaped and the laser light is selectively irradiated to only a given region as in the related art. Accordingly, it is possible that the laser light LB1 is not shaped but irradiated to the whole area, and only the red transfer layer 200R on the reflecting layer 120 is not removed but left. As the laser light LB1, for example, semiconductor laser light having a wavelength of 800 nm is used. The irradiation conditions can be, for example, 0.3 mW/$\mu m^2$ and the scanning rate of 50 mm/s.

Figure 7:
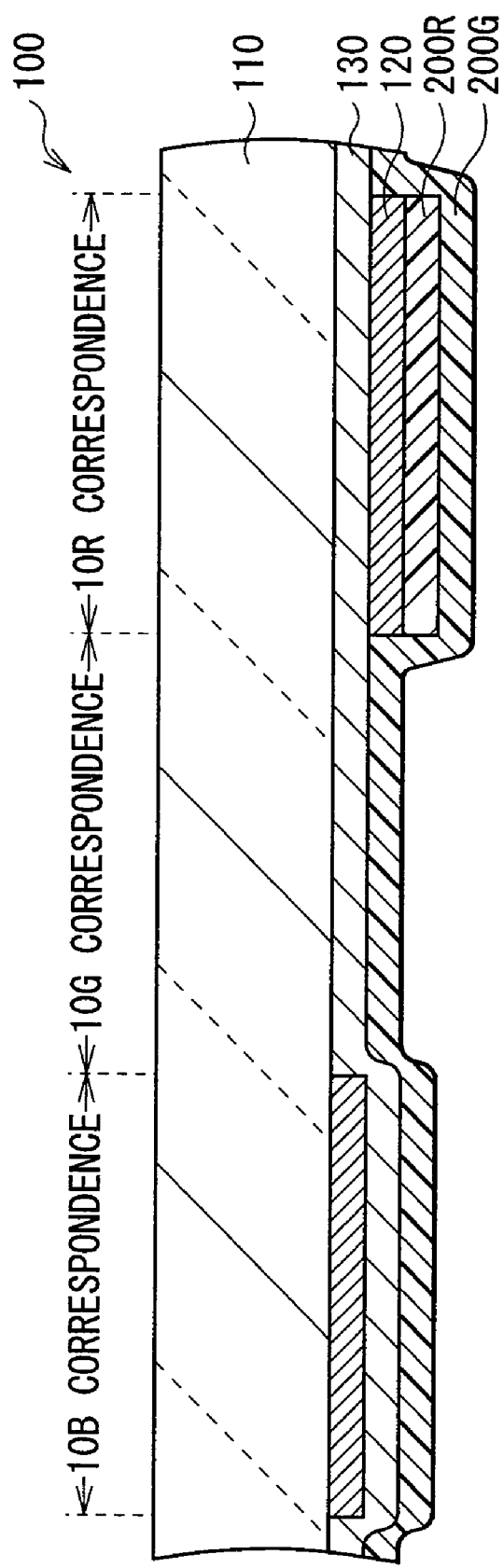
FIG. 7 A cross section view showing a step following FIG. 6.

Subsequently, as shown in FIG. 7, a green transfer layer 200G containing the foregoing green light emitting material is formed on the whole area on the front face side of the base 110 by, for example, vacuum evaporation (step S203). Accordingly, the donor substrate 100 in which the red transfer layer 200R is formed in part of the front face side of the base 110 and the green transfer layer 200G is formed on the whole area on the front face side of the base 110 is formed.

(Collective Transfer Step)

Figure 8:
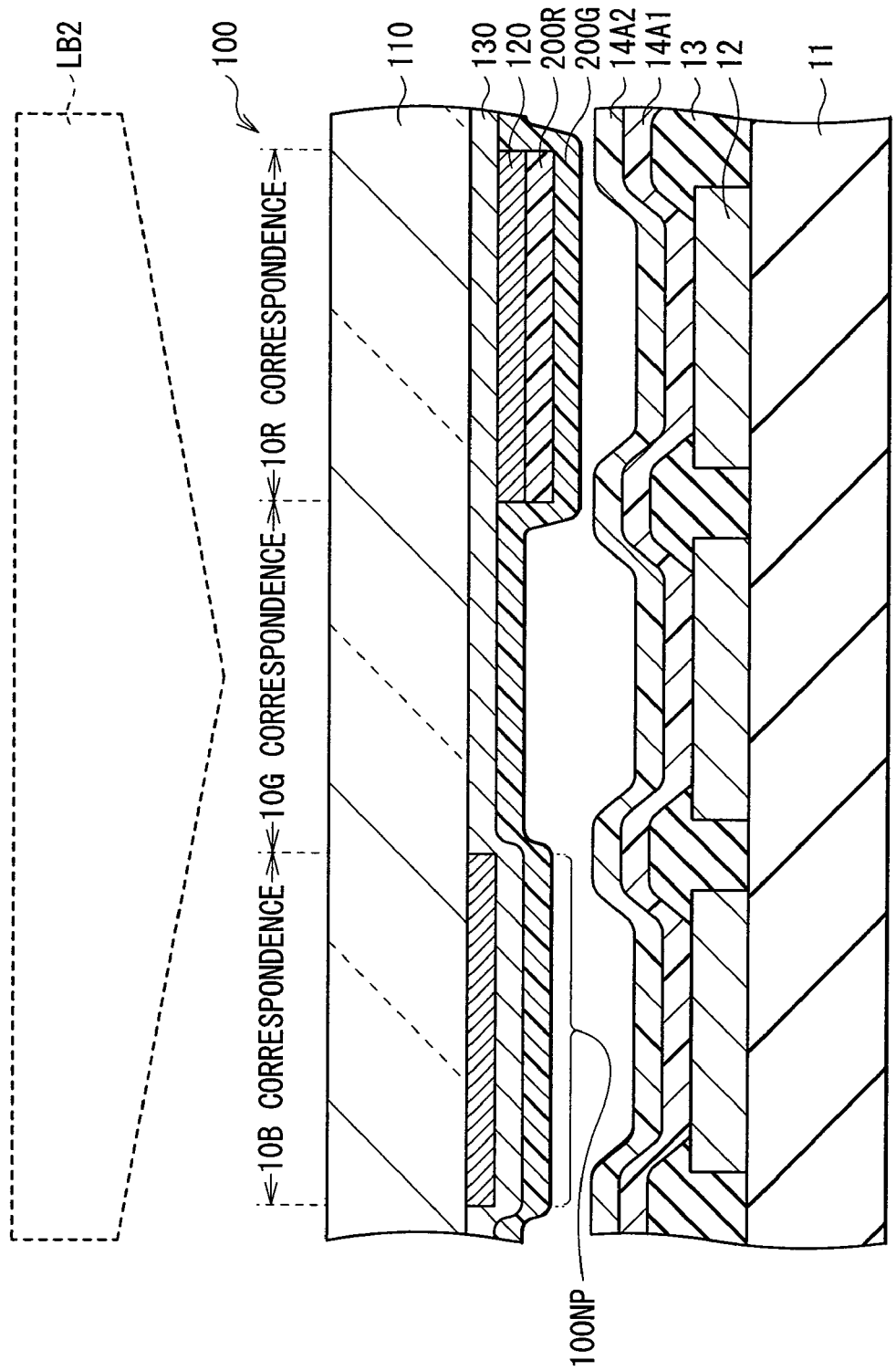
FIG. 8 A cross section view showing a step following FIG. 7.
Figure 9:
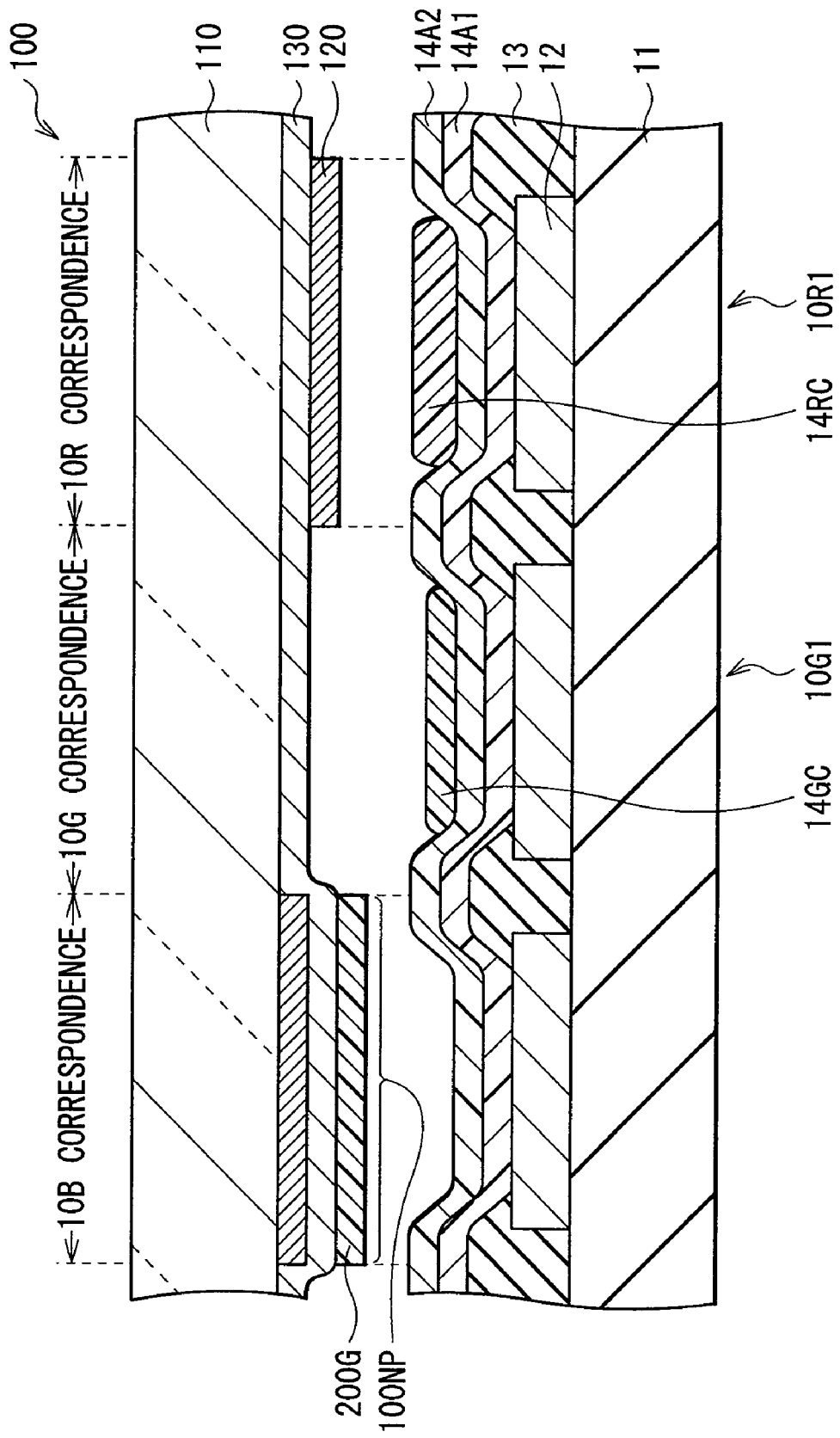
FIG. 9 A cross section view showing a step following FIG. 8.

After that, as shown in FIG. 8, the donor substrate 100 and the substrate 11 are oppositely arranged, laser light LB2 is irradiated from the rear face side of the base 110. Thereby, the red transfer layer 200R and the section other than the non-transfer region 100NP of the green transfer layer 200G are transferred at a time (step S300). Thereby, as shown in FIG. 9, the mixed layer 14RC is formed in the planned formation region 10R1 of the red organic light emitting element 10R, and at the same time, the green monochromatic layer 14GC is formed in the planned formation region 10G1 of the green organic light emitting element 10G. In this case, since the reflecting layer 120 is provided in the non-transfer region 100NP, it is not necessary to perform the complicated step that a spot shape of laser light is shaped and the laser light is selectively irradiated to a given region as in the related art. Accordingly, it is possible that the laser light LB2 is not shaped but irradiated to the whole area, and only the green transfer layer 200G in the non-transfer region 100NP is not transferred but left. As the laser light LB2, for example, semiconductor laser light having a wavelength of 800 nm is used. The irradiation conditions can be, for example, 0.3 mW/$\mu m^2$ and the scanning rate of 50 mm/s.

After the collective transfer step is performed, for the donor substrate 100, the foregoing transfer layer formation steps (steps S201, S202, and S203) are sequentially performed again, and thereby the red transfer layer 200R and the green transfer layer 200G are formed again to perform the collective transfer step for another substrate 11. FIG. 10 shows a process of fabricating and recycling the donor substrate 100 described above. For the unused donor substrate 100 shown in FIG. 10(A), the red transfer layer 200R is formed on the whole area on the front face side of the base 110 as shown in FIG. 10(B) (step S201). As shown in FIG. 10(C), the laser light LB1 is irradiated to selectively remove the red transfer layer 200R (step S202). After that, as shown in FIG. 10(D), the green transfer layer 200G is formed on the whole area on the front face side of the base 110 (step S203). Next, as shown in FIG. 10(E), the collective transfer step is performed (step S300). At this time, the green transfer layer 200G is left in the non-transfer region 100NP of the donor substrate 100. Subsequently, as shown in FIG. 10(F), while leaving the green transfer layer 200G in the non-transfer region 100NP, the red transfer layer 200R is formed on the front face side of the base 110 (step S201). When the laser light LB1 is irradiated as shown in FIG. 10(C), the red transfer layer 200R can be selectively removed, and at the same time, the green transfer layer 200G remaining in the non-transfer region 100NP can be removed (step S202). After that, as shown in FIG. 10(D), the green transfer layer 200G is formed on the whole area on the front face side of the base 110 (step S203). Accordingly, the closed loop of the steps shown in FIG. 10(C) to FIG. 10(F) can be configured. Thus, steps for washing and reusing the donor substrate 100 after collective transfer and equipment thereof become unnecessary. In addition, it becomes possible to repeatedly use the donor substrate without disposing used only once.

(Blue Monochromatic Layer Formation Step)

Figure 11:
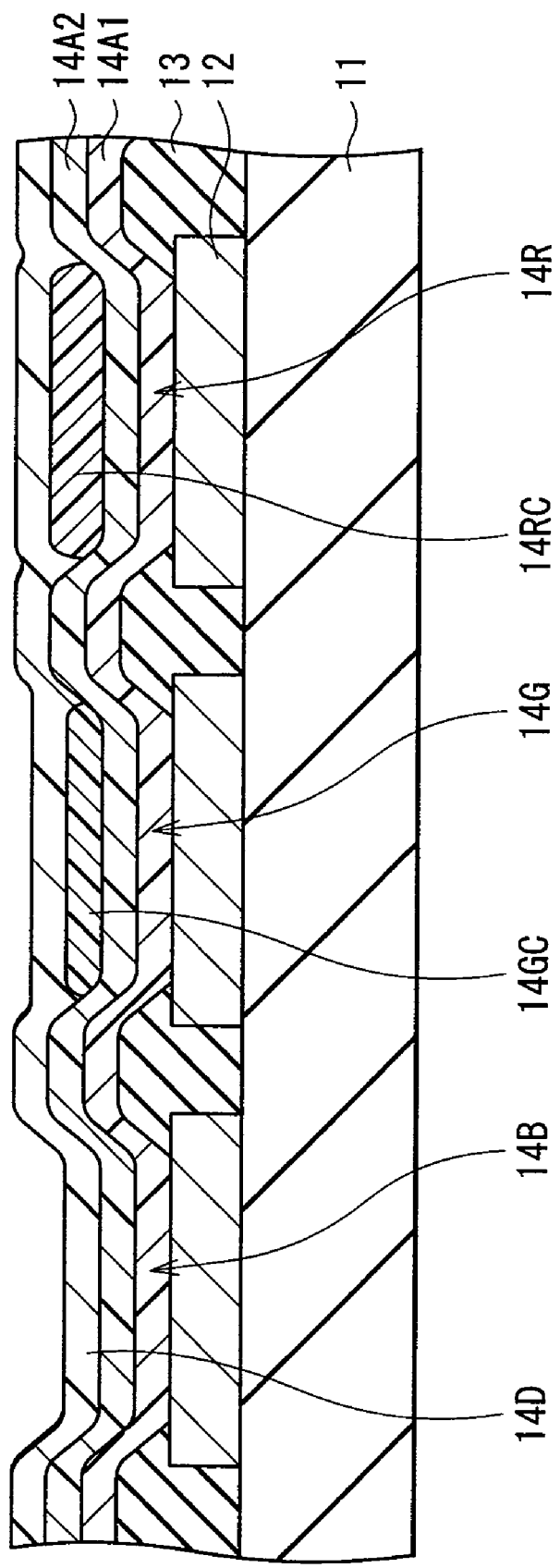
FIG. 11 A cross section view showing a step following FIG. 9.

Meanwhile, for the substrate 11 after the collective transfer step, as shown in FIG. 11, the blue monochromatic layer 14D containing the foregoing blue light emitting material is formed on the whole area by, for example, evaporation (step S401). Thereby, it is not necessary to perform transfer three times that is the same number as the number of light emitting colors as before, and thus the number of transfers can be reduced down to one.

Further, following the blue monochromatic layer 14D, the electron transport layer 14E and the second electrode 15 are formed on the whole area by, for example, evaporation (step S402). Accordingly, the red organic light emitting element 10R, the green organic light emitting element 10G, and the blue organic light emitting element 10B are formed.

After the red organic light emitting element 10R, the green organic light emitting element 10G, and the blue organic light emitting element 10B are formed, the protective film 16 made of the foregoing material is formed thereon (step S403). As a method of forming the protective film 16, a film-forming method in which the energy of film-forming particles is small to the degree not affecting the foundation such as evaporation method or CVD method is preferable. Further, the protective film 16 is desirably formed in a succession of the formation of the second electrode 15 without exposing the second electrode 15 in the air. Thereby, the red organic layer 14R, the green organic layer 14G, and the blue organic layer 14B can be inhibited from being deteriorated due to moisture and oxygen in the air. Further, to prevent lowering of the luminance due to deterioration of the red organic layer 14R, the green organic layer 14G, and the blue organic layer 14B, it is desirable that the film forming temperature of the protective film 16 is set to an ambient temperature, and the protective film 16 is formed under conditions that the stress of the film becomes the minimum to prevent peeling of the protective film 16.

After that, the adhesive layer 20 is formed on the protective film 16, and the sealing substrate 30 is bonded to the protective film 16 with the adhesive layer 20 in between (step S404). Accordingly, the display device shown in FIG. 1 is fabricated.

Figure 12:
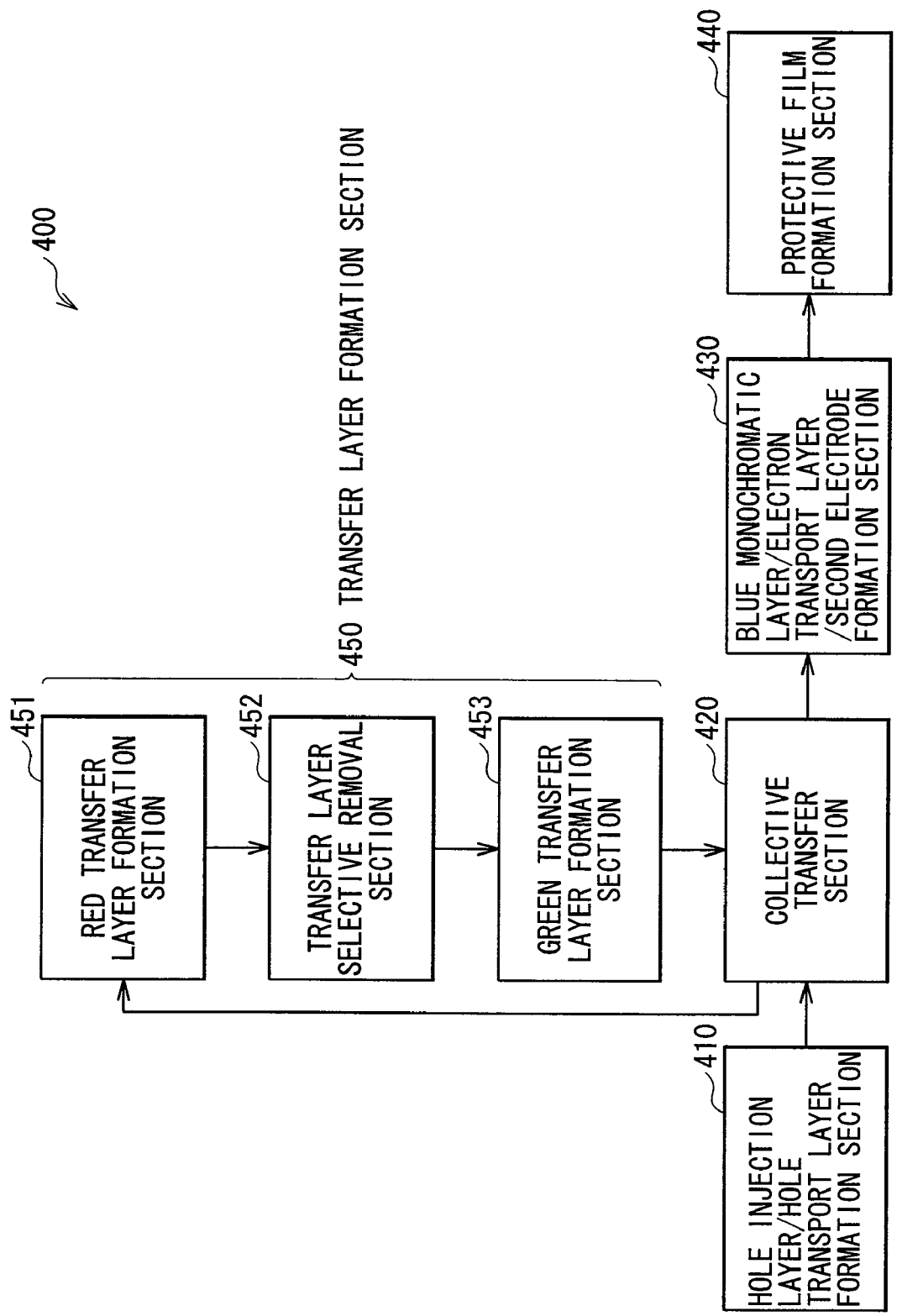
FIG. 12 A diagram schematically showing an example of a system of manufacturing a display device according to the method of manufacturing the display device shown in FIG. 2.

FIG. 12 schematically shows an example of a system of manufacturing a display device according to the manufacturing method shown in FIG. 2. In such a manufacturing system 400, for example, a hole injection layer/hole transport layer formation section 410 forming the hole injection layer 14A1 and the hole transport layer 14A2 over the substrate 11 on which the first electrode 12 and the insulating film 13 are formed; a collective transfer section 420 performing the collective transfer step; a blue monochromatic layer/electron transport layer/second electrode formation section 430 forming the blue monochromatic layer 14D, the electron transport layer 14E, and the second electrode 15; and a protective film formation section 440 forming the protective film 16 are arranged linearly. The collective transfer section 420 is connected with a transfer layer formation section 450 performing the foregoing transfer layer formation step. In the transfer layer formation section 450, a red transfer layer formation section 451 forming the red transfer layer 200R on the whole area on the front face side of the base 110; a transfer layer selective removal section 452 selectively removing the red transfer layer 200R by irradiating the laser light LB1 from the front face side of the base 110; and a green transfer layer formation section 453 forming the green transfer layer 200G on the whole area of the front face side of the base 110 are arranged linearly. The respective sections are not necessarily arranged linearly, but may be arranged radially.

In the display device, when a given voltage is applied between the first electrode 12 and the second electrode 15, a current is injected into the mixed layer 14RC, the green monochromatic layer 14GC, and the blue monochromatic layer 14D, electron-hole recombination occurs, and thereby light is generated. The light is transmitted through the second electrode 15, the protective film 16, and the sealing substrate 30, and extracted. In the red organic light emitting element 10R, the red organic layer 14R has the mixed layer 14CR containing the red light emitting material and the green light emitting material and the blue monochromatic layer 14D containing the blue light emitting material. Then, energy transfer is generated in red having the lowest energy level and thus red light emission becomes dominant. In the green organic light emitting element 10G, the green organic layer 14G has the green monochromatic layer 14GC containing the green light emitting material and the blue monochromatic layer 14D containing the blue light emitting material. Then, energy transfer is generated in green having the lower energy level and thus green light emission becomes dominant. In the blue organic light emitting element 10B, the blue organic layer 14B has only the blue monochromatic layer 14D containing the blue light emitting material. Thus, blue light emission is generated.

As described above, in this embodiment, the red organic layer 14R has the mixed layer 14RC containing the red light emitting material and the green light emitting material. Thus, the mixed layer 14RC can be formed by the simple step that the red transfer layer 200R and the green transfer layer 200G are transferred at a time from the donor substrate 100 by thermal transfer method.

Further, the donor substrate 100 is provided with the reflecting layer 120 in the red transfer layer planned formation region 100R1 viewed from the front face side of the base 110. Thus, after the red transfer layer 200R is formed on the whole area on the front face side of the base 100, the donor substrate 100 and the substrate 11 are oppositely arranged, the laser light LB1 is irradiated from the front face side of the base 110, and thereby the red transfer layer 200R can be selectively removed and the red transfer layer 200R can be left only on the reflecting layer 120.

Further, the donor substrate 100 is provided with the reflecting layer 120 in the non-transfer region 100NP viewed from the rear face side of the base 110. Thus, after the green transfer layer 200G is formed on the whole area on the front face side of the base 110, the donor substrate 100 and the substrate 11 are oppositely arranged, the laser light LB2 is irradiated from the rear face side of the base 110, and thereby the section other than the non-transfer region 100NP of the green transfer layer 200G can be selectively transferred to the substrate 11 and the section in the non-transfer region 100NP can be left on the base 110 without being transferred.

In addition, according to the method of manufacturing a display device or the manufacturing system of this embodiment, the red transfer layer 200R and the green transfer layer 200G are formed in the foregoing donor substrate 100 and are transferred at a time to the substrate 11. Thus, the transfer for forming the red organic light emitting element 10R and the green organic light emitting element 10G can be performed one time, and thus the display device can be manufactured by the simple steps.

Furthermore, the number of complicated steps such as matching the donor substrate 100 with the substrate 11, separation, and laser irradiation is reduced, the device configuration is simplified to reduce the device cost, and the takt time is shorten to improve productivity. Further, since the number of transfers can be reduced, failures caused by transfer can be reduced, each exclusive donor substrate 100 for each color is not necessary, and thus the running cost can be reduced.

In addition, when the transfer layer formation step is performed again for the donor substrate 100 in which the collective transfer step has been provided to form the red transfer layer 200R and the green transfer layer 200G again, and the collective transfer step is performed for another substrate 11, steps of washing and reusing the donor substrate 100 provided with collective transfer and equipment thereof become unnecessary. In addition, the donor substrate 100 can be repeatedly used without disposing used only once. Thus, the device configuration can be simplified, and the device cost and the cost of the donor substrate can be further reduced.

Furthermore, when the blue monochromatic layer 14D common to the red organic light emitting element 10R, the green organic light emitting element 10G, and the blue organic light emitting element 10B is formed by evaporation method or the like after performing the collective transfer step, it is not necessary to perform transfer three times that is the same number as the number of light emitting colors as before, and thus the number of transfers can be reduced down to one.

(Modification)

Figure 13:
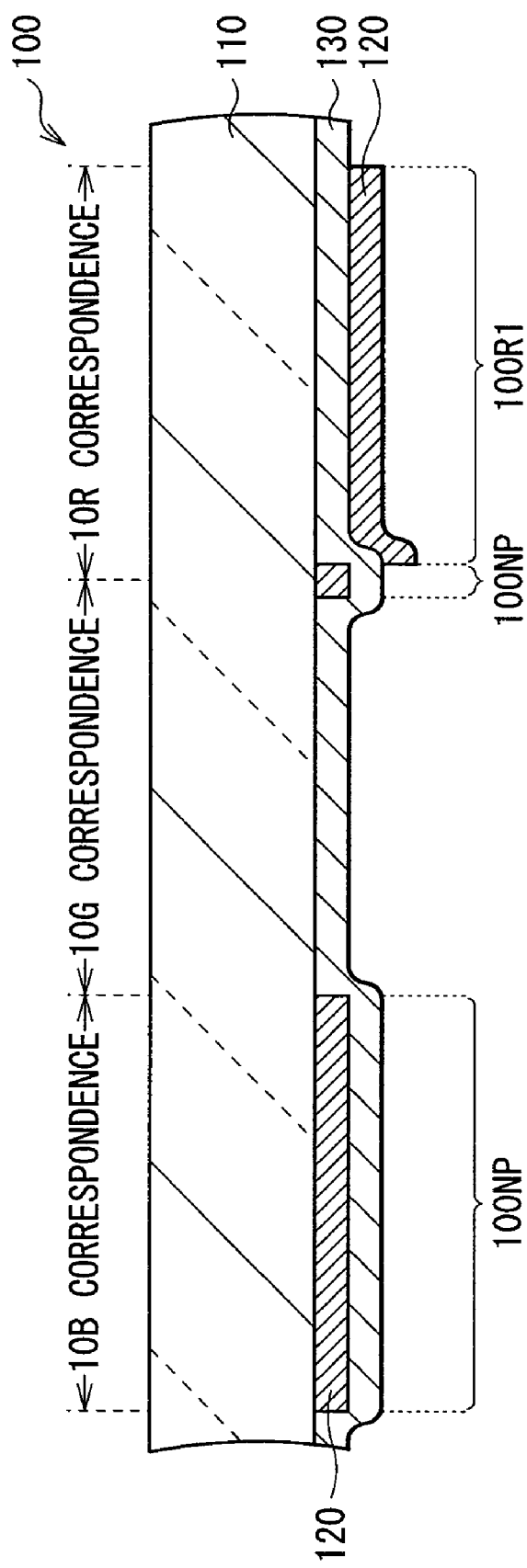
FIG. 13 A cross section view showing a structure of a donor substrate according to a modification of the present invention.

FIG. 13 shows a structure of a donor substrate according to a modification of the present invention in a state that the donor substrate is not used yet. In the donor substrate 100, the non-transfer region 100NP corresponds to the boundary region between the red organic light emitting element 10R and the green organic light emitting element 10G in the substrate 11. Thereby, in the donor substrate 100, in the collective transfer step, the boundary between the mixed layer 14RC and the green monochromatic layer 14GC can be clearly formed, and color mixture can be surely inhibited. FIG. 13 shows a case where the reflecting layer 120 is additionally formed between the absorbing layer 130 and the base 110 correspondingly to the boundary region in the donor substrate 100 in which the absorbing layer 130 is formed on the whole area on the front side of the base 110 and the reflecting layer 120 is partially provided as shown in FIG. 4.

Figure 14:
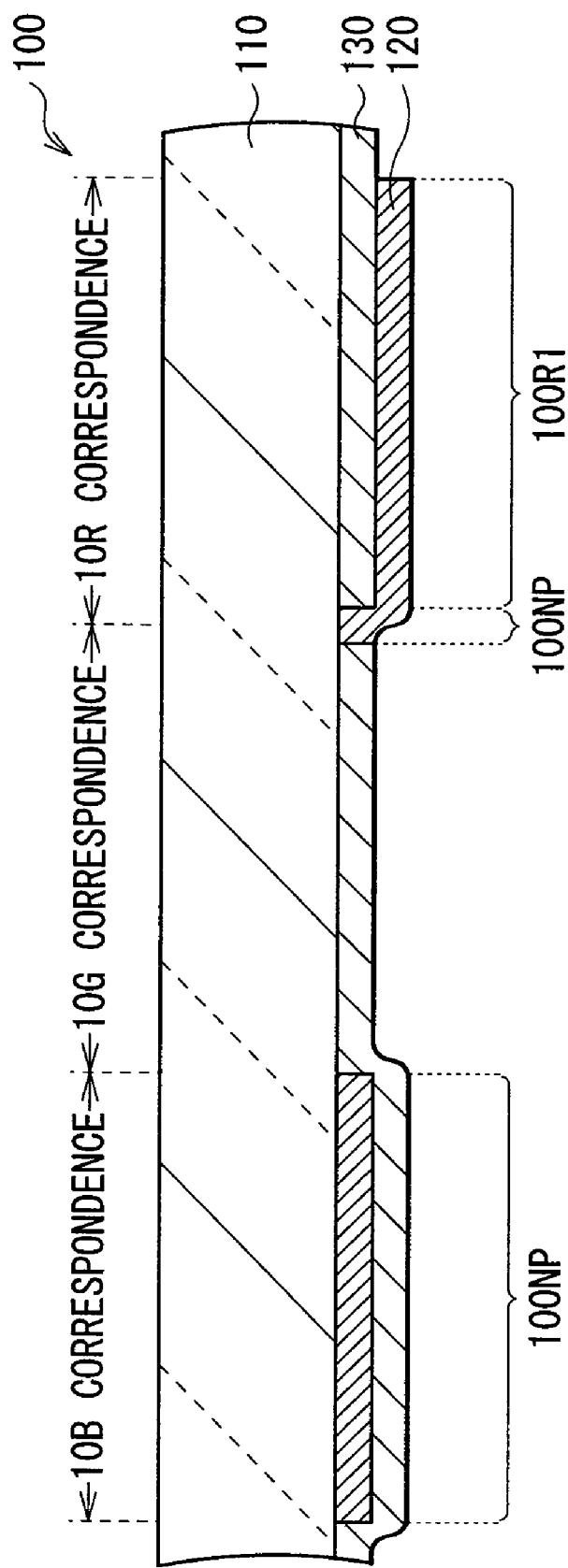
FIG. 14 A cross section view showing a modification of the donor substrate shown in FIG. 13.
Figure 15:
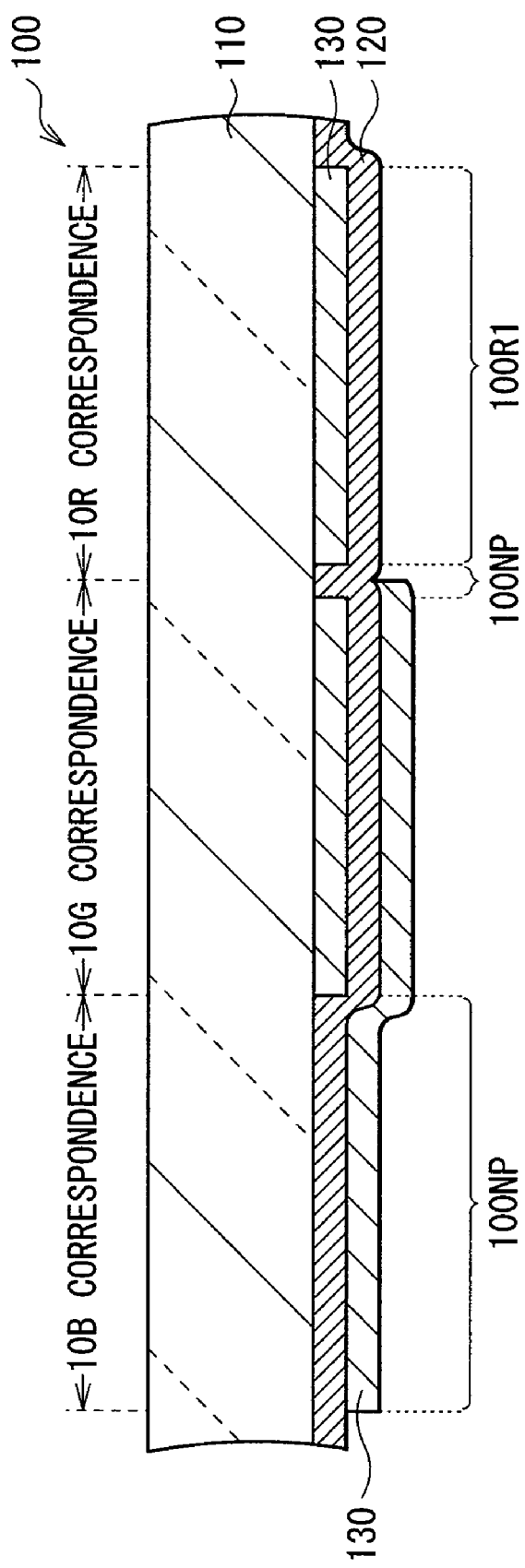
FIG. 15 A cross section view showing another modification of the donor substrate shown in FIG. 13.

The lamination structure of the reflecting layer 120 and the absorbing layer 130 for providing the non-transfer region NP in the boundary region is not limited to the structure shown in FIG. 13 but may be other lamination structure, as long as the reflecting layer 120 is formed correspondingly to the boundary region viewed from the rear face side of the base 110. For example, as shown in FIG. 14, it is possible that part of the absorbing layer 130 is removed correspondingly to a boundary region 10M, and the removed region is coated with the reflecting layer 120. Further, it is possible that in the donor substrate 100 in which the reflecting layer 120 is formed on the whole area on the front face side of the base 110 and the absorbing layer 130 is partially provided as shown in FIG. 5, part of the absorbing layer 130 between the reflecting layer 120 and the base 110 can be removed correspondingly to the boundary region as shown in FIG. 15.

While the invention has been described with reference to the embodiment, the invention is not limited to the foregoing embodiment, and various modifications may be made. For example, in the foregoing embodiment, the description has been given of the case where laser light is irradiated in the transfer layer formation step and the collective transfer step. However other radiant ray such as a lamp may be irradiated.

Further, in the foregoing embodiment, the description has been given of the case where the reflecting layer 120 and the absorbing layer 130 are formed on the side opposed to the substrate 11 of the base 110. However, as long as the foregoing conditions of lamination structure are satisfied, the reflecting layer 120 and the absorbing layer 130 may be provided on the other side of the substrate 11 of the base 110. However, it is desirable that the reflecting layer 120 and the absorbing layer 130 are formed on the side opposed to the substrate 11 of the base 110. In this case, the precision of the formation positions and the transfer positions of the red transfer layer 200R and the green transfer layer 200G are easily improved.

Further, for example, the material and the thickness of the respective layers, the film-forming method, the film-forming conditions, and irradiation conditions of the laser lights LB1 and LB2 and the like are not limited to those described in the foregoing embodiment, but other material, other thickness, other film-forming method, other film-forming conditions, and other irradiation conditions may be adopted. For example, the first electrode 12 may be made of IZO (indium zinc composite oxide) in addition to ITO. Further, the first electrode 12 may be composed of a reflective electrode. In this case, it is desirable that the first electrode 12 is, for example 100 nm to 1000 nm thick, and has a high reflectance as much as possible to increase the light emitting efficiency. For example, as a material of the first electrode 12, a simple substance or an alloy of a metal element such as chromium (Cr), gold (Au), platinum (Pt), nickel (Ni), copper (Cu), tungsten (W), and silver (Ag) is cited. Further, for example, the first electrode 12 may have a dielectric multilayer film.

In addition, for example, in the foregoing embodiment, the description has been given of the case where the first electrode 12, the organic layer 14, and the second electrode 15 are stacked sequentially from the substrate 11 side over the substrate 11, and the light is extracted from the sealing substrate 30 side. However, it is possible that the stacking order is reversed. That is, it is possible that the second electrode 15, the organic layer 14, and the first electrode 12 are sequentially stacked from the substrate 11 side over the substrate 11, and the light is extracted from the substrate 11 side.

Furthermore, for example, in the foregoing embodiment, the description has been given of the case where the first electrode 12 is used as an anode and the second electrode 15 is used as a cathode. However, it is possible that the anode and the cathode are reversed. That is, it is possible that the first electrode 12 is used as a cathode and the second electrode 15 is used as an anode. Further, it is possible that the first electrode 12 is used as a cathode and the second electrode 15 is used as an anode, the second electrode 15, the organic layer 14, and the first electrode 12 are sequentially stacked from the substrate 11 side over the substrate 11, and the light is extracted from the substrate 11 side.

In addition, in the foregoing embodiment, the description has been specifically given of the structure of the red organic light emitting element 10R, the green organic light emitting element 10G, and the blue organic light emitting element 10B. However, it is not necessary to provide all layers, and other layer may be further provided. For example, a hole injection thin film layer made of chromium oxide (III) ($Cr_2O_3$), ITO (Indium-Tin Oxide: oxide mixed film of indium (In) and tin (Sn)) or the like may be provided between the first electrode 12 and the organic layer 14.

Furthermore, in the foregoing embodiment, the description has been given of the case where the second electrode 15 is made of the semi-transmissive electrode, and the light generated in the mixed layer 14RC, the green monochromatic layer 14GC, and the blue monochromatic layer 14D is extracted from the second electrode 15 side. However, the generated light may be extracted from the first electrode 12 side. In this case, it is desirable that the second electrode 15 has reflectance as high as possible to increase the light emitting efficiency.

The invention claimed is:

1. A method of transferring a transfer layer from a donor substrate in which the transfer layer is selectively formed in part of a front face side of a base to another substrate, wherein as the donor substrate, a donor substrate is used in which a reflecting layer is provided in a planned formation region of the transfer layer and an absorbing layer is provided in a region other than the planned formation region of the transfer layer as viewed from the front face side of the base, the transfer method comprising the steps of:

forming the transfer layer on a whole area on the front face side of the base;

irradiating a radiant ray from the front face side of the base and thereby selectively removing the transfer layer in the region where the absorbing layer is formed viewed from the front face side of the base; and oppositely arranging the donor substrate and the other substrate, irradiating a radiant ray from a rear face side of the base, and thereby transferring the transfer layer on the reflecting layer to the other substrate.

2. A method of selectively transferring part of a transfer layer from a donor substrate in which the transfer layer is formed over a base to another substrate, wherein as the donor substrate, a donor substrate is used in which a reflecting layer is provided in a non-transfer region of the transfer layer not being transferred to the other substrate and an absorbing layer is provided in a region other than the non-transfer region viewed from a rear face side of the base, the method comprising the steps of:

forming the transfer layer on a whole area on a front face side of the base; and oppositely arranging the donor substrate and the other substrate, irradiating a radiant ray from the rear face side of the base, and thereby selectively transferring other portions than the non-transfer region out of the transfer layer to the other substrate.

3. A method of manufacturing a display device comprising, on a substrate, a red organic light emitting element, a green organic light emitting element, and a blue organic light emitting element, wherein a donor substrate is used that (a) has a reflecting layer in a red transfer layer planned formation region of corresponding to a planned formation region of the red organic light emitting element in the substrate and an absorbing layer in a region other than the red transfer layer planned formation region as viewed from a front face side of a base, and (b) has the reflecting layer in a green transfer layer non-transfer region and the absorbing layer in a region other than the green transfer layer non-transfer region as viewed from a rear face side of the base, the manufacturing method comprising the steps of:

a transfer layer formation step of forming the red transfer layer containing a red light emitting material on a whole area on the front face side of the base, irradiating a radiant ray from the front face side of the base, and thereby selectively removing the red transfer layer in the region where the absorbing layer is formed viewed from the front face side of the base, and then forming the green transfer layer containing a green light emitting material on the whole area on the front face side of the base; and a collective transfer step of oppositely arranging the donor substrate and the substrate and irradiating a radiant ray from the rear face side of the base, and thereby transferring the red transfer layer and other portions than the green transfer layer non-transfer region of the green transfer layer to the substrate at a time.

4. The method of manufacturing a display device according to claim 3, wherein the green transfer layer non-transfer region corresponds to a planned formation region of the blue organic light emitting element in the substrate.

5. The method of manufacturing a display device according to claim 3, wherein the green transfer layer non-transfer region corresponds to a boundary region between the red organic light emitting element and the green organic light emitting element in the substrate.

6. The method of manufacturing a display device according to claim 3, wherein after the collective transfer step, the transfer layer formation step is performed again and thereby the red transfer layer and the green transfer layer are formed again, and the collective transfer step is performed on other substrate.

7. The method of manufacturing a display device according to claim 3, wherein a blue monochromatic layer formation step of forming a blue monochromatic layer containing a blue light emitting material in planned formation regions of the red organic light emitting element, the green organic light emitting element, and the blue organic light emitting element in the substrate after collective transfer by the collective transfer step is included.

8. A system of manufacturing a display device comprising, on a substrate, a red organic light emitting element, a green organic light emitting element, and a blue organic light emitting element, wherein:

a donor substrate is used that (a) has a reflecting layer in a red transfer layer planned formation region corresponding to a planned formation region of the red organic light emitting element in the substrate and an absorbing layer in a region other than the red transfer layer planned formation region viewed from a front face side of a base, and (b) has the reflecting layer in a green transfer layer non-transfer region and the absorbing layer in a region other than the green transfer layer non-transfer region viewed from a rear face side of the base, a transfer layer formation section including a red transfer layer formation section forming the red transfer layer containing a red light emitting material on a whole area on the front face side of the base, a transfer layer selective removal section irradiating a radiant ray from the front face side of the base and thereby selectively removing the red transfer layer in the region where the absorbing layer is formed viewed from the front face side of the base, and a green transfer layer formation section forming the green transfer layer containing a green light emitting material on the whole area on the front face side of the base, and a collective transfer section oppositely arranging the donor substrate and the substrate and irradiating a radiant ray from the rear face side of the base, and thereby transferring the red transfer layer and other portions than the green transfer layer non-transfer region of the green transfer layer to the substrate at a time are included.

9. The system of manufacturing a display device according to claim 8, wherein a blue monochromatic layer formation section forming a blue monochromatic layer containing a blue light emitting material in planned formation regions of the red organic light emitting element, the green organic light emitting element, and the blue organic light emitting element in the substrate after collective transfer by the collective transfer section is included.

* * * * *